United States Patent
Hong et al.

(10) Patent No.: US 9,947,644 B2
(45) Date of Patent: Apr. 17, 2018

(54) SEMICONDUCTOR PACKAGE

(71) Applicant: SAMSUNG ELECTRONICS CO., LTD., Suwon-si, Gyeonggi-do (KR)

(72) Inventors: Jinhee Hong, Daegu (KR); Wansoo Park, Seoul (KR); Chul Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/268,658

(22) Filed: Sep. 19, 2016

(65) Prior Publication Data

US 2017/0170156 A1    Jun. 15, 2017

(30) Foreign Application Priority Data

Dec. 15, 2015  (KR) .................. 10-2015-0179362

(51) Int. Cl.
| | | |
|---|---|---|
| *H01L 23/498* | (2006.01) | |
| *H01L 25/18* | (2006.01) | |
| *H01L 23/00* | (2006.01) | |
| *H01L 25/065* | (2006.01) | |

(52) U.S. Cl.
CPC ........ *H01L 25/18* (2013.01); *H01L 23/49816* (2013.01); *H01L 23/49838* (2013.01); *H01L 24/48* (2013.01); *H01L 25/0652* (2013.01); *H01L 25/0657* (2013.01); *H01L 2224/48137* (2013.01); *H01L 2224/48145* (2013.01); *H01L 2225/0651* (2013.01); *H01L 2225/0652* (2013.01); *H01L 2225/06506* (2013.01); *H01L 2225/06562* (2013.01); *H01L 2225/06572* (2013.01); *H01L 2924/1431* (2013.01); *H01L 2924/1434* (2013.01)

(58) Field of Classification Search
CPC ......... H01L 23/49816; H01L 23/49838; H01L 24/48; H01L 25/18; H01L 25/0652; H01L 25/0657

See application file for complete search history.

(56) References Cited

U.S. PATENT DOCUMENTS

| | | | |
|---|---|---|---|
| 6,208,579 B1 | 3/2001 | Prutchi et al. | |
| 8,611,125 B2* | 12/2013 | Hong ............... | H01L 24/48 257/686 |
| 8,890,330 B2* | 11/2014 | Kim ................ | H01L 24/48 257/686 |
| 9,275,947 B2* | 3/2016 | Ozawa ............ | H01L 23/49838 |
| 9,299,685 B2* | 3/2016 | Kim ................ | H01L 23/49822 |
| 2006/0267173 A1 | 11/2006 | Takiar et al. | |
| 2007/0218588 A1 | 9/2007 | Takiar et al. | |
| 2008/0054435 A1 | 3/2008 | Mehta et al. | |
| 2008/0179734 A1 | 7/2008 | Kwon et al. | |
| 2008/0246162 A1 | 10/2008 | Kwon et al. | |
| 2010/0224976 A1 | 9/2010 | Silvestri et al. | |
| 2011/0175222 A1 | 7/2011 | Kim et al. | |
| 2012/0049365 A1 | 3/2012 | Ko et al. | |
| 2012/0187574 A1 | 7/2012 | Sasaki et al. | |
| 2013/0119542 A1 | 5/2013 | Oh | |

(Continued)

*Primary Examiner* — Cuong Q Nguyen
(74) *Attorney, Agent, or Firm* — Lee & Morse, P.C.

(57) ABSTRACT

A semiconductor package is provided. The semiconductor package may include a plurality of memory chips, which are mounted on a top surface of a package substrate, and a plurality of controller chips, which are vertically stacked on at least one of top and bottom surfaces of the package substrate.

20 Claims, 13 Drawing Sheets

(56) References Cited

U.S. PATENT DOCUMENTS

2013/0127070 A1    5/2013   Jung et al.
2014/0167291 A1    6/2014   Nam et al.
2015/0115438 A1    4/2015   Lee et al.

* cited by examiner

SEMICONDUCTOR PACKAGE

CROSS-REFERENCE TO RELATED APPLICATION

Korean Patent Application No. 10-2015-0179362, filed on Dec. 15, 2015, in the Korean Intellectual Property Office, and entitled: "Semiconductor Package," is incorporated by reference herein in its entirety.

BACKGROUND

1. Field

The present disclosure relates to a semiconductor package, and in particular, to a semiconductor package including a plurality of vertically-stacked memory chips.

2. Description of the Related Art

Due to their small-size, multifunctionality, and/or low-cost characteristics, semiconductor devices are important elements in the electronic industry. Generally, the semiconductor devices are classified into a memory device for storing data, a logic device for processing data, and a hybrid device for performing various functions.

As the electronic industry advances, there is an increasing demand for a semiconductor device with a higher integration density and higher performance. Various studies are being conducted to meet such a demand.

SUMMARY

Embodiments are directed to a semiconductor package, including a package substrate including a first surface and a second surface opposite to each other, memory chips on the first surface of the package substrate, and controller chips vertically stacked on at least one of the first and second surfaces of the package substrate and electrically connected to the memory chips and the package substrate.

Embodiments are also directed to a semiconductor package, including a package substrate including a first surface and a second surface opposite to each other, a memory chip structure including memory chips vertically stacked on the first surface of the package substrate, and a controller chip structure on the second surface of the package substrate and including at least two controller chips vertically stacked on the package substrate. The memory chip structure may further include first bonding wires, each of which is provided to electrically connect at least two of the memory chips to each other, and second bonding wires, each of which is provided to electrically connect at least one of the memory chips to the package substrate. The controller chip structure may further include third bonding wires, each of which is provided to electrically connect one of the controller chips to the package substrate.

Embodiments are also directed to a semiconductor package, including a package substrate including a first surface and a second surface opposite to each other, a memory chip structure including memory chips vertically stacked on the first surface of the package substrate, a controller chip structure on the first surface of the package substrate and including at least two controller chips vertically stacked on the package substrate, and bonding wires electrically connecting the memory chip structure to the controller chip structure.

Embodiments are also directed to a semiconductor device, including first semiconductor chips arranged in a first stack on a substrate, the first semiconductor chips being memory controllers, and second semiconductor chips arranged in a second stack on the substrate, the second semiconductor chips being memory chips controlled based on signals from the first semiconductor chips, the second semiconductor chips including a first set of second semiconductor chips controlled by a first one of the first semiconductor chips, and including a second set of second semiconductor chips controlled by a second one of the first semiconductor chips.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
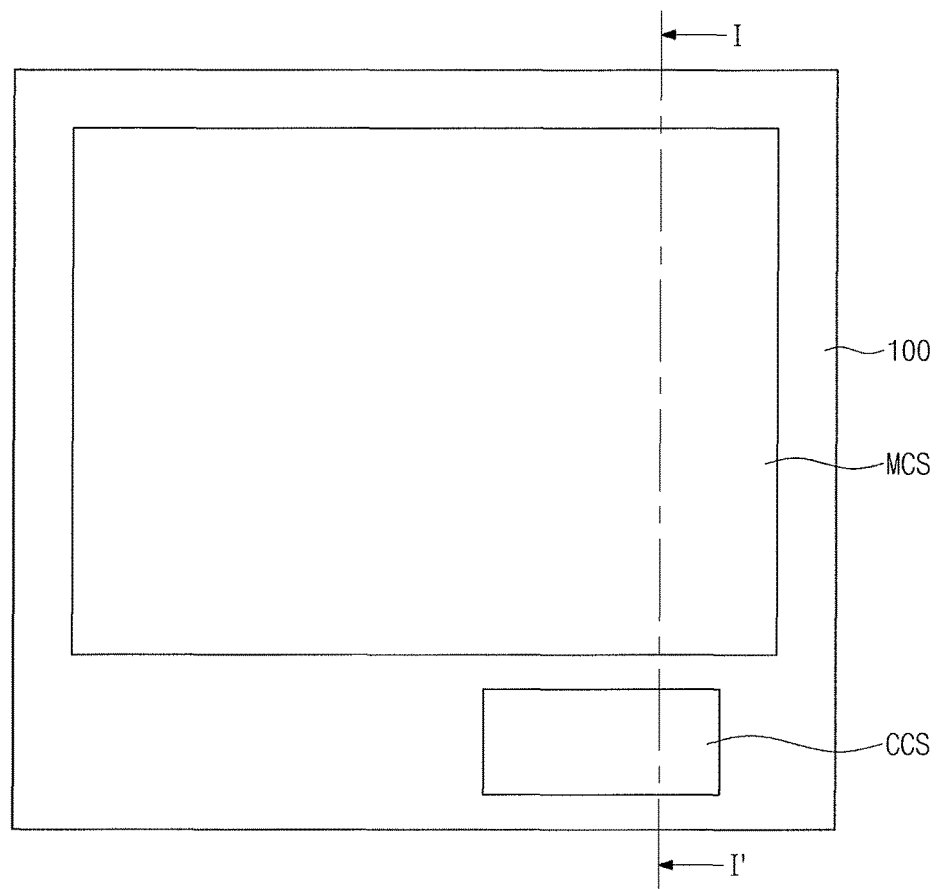
FIG. 1 illustrates a plan view of a semiconductor package according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element is referred to as being "connected" or "coupled" to another element, it may be directly connected or coupled to the other element or intervening elements may be present.

Figure 2A:
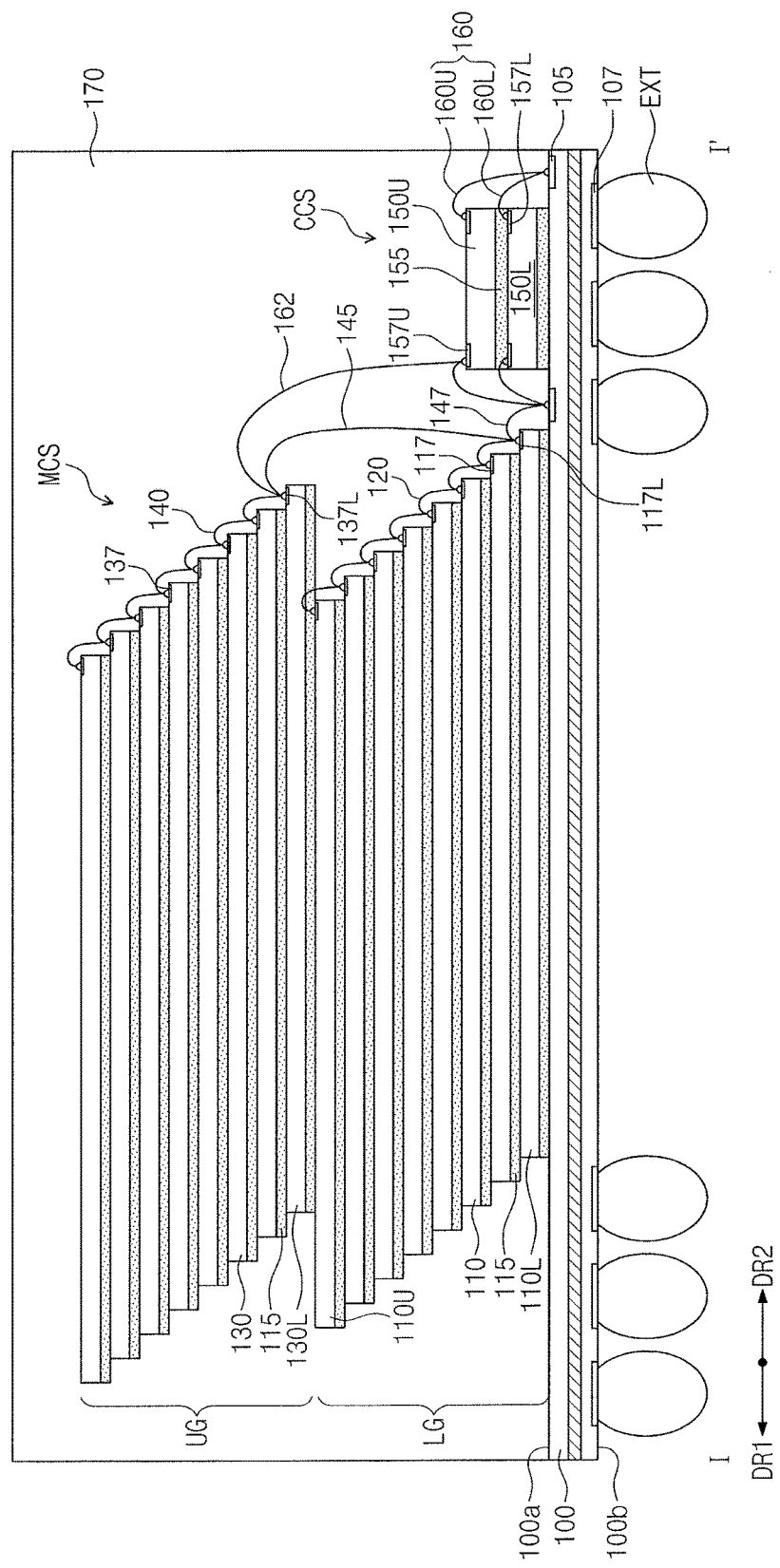
FIGS. 2A, 2B, and 3 illustrate sectional views taken along line I-I' of FIG. 1 according to example embodiments.
Figure 2B:
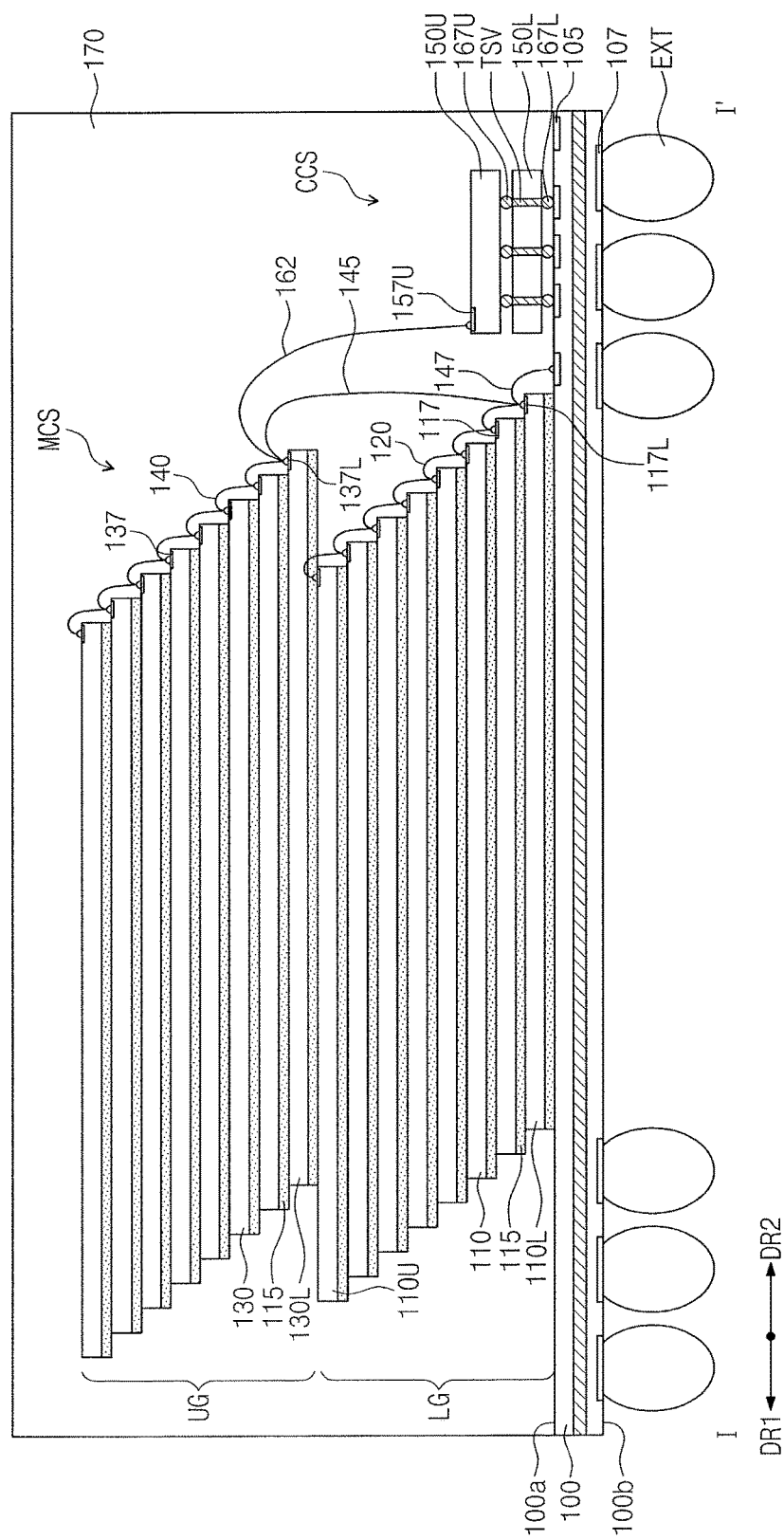
Figure 3:
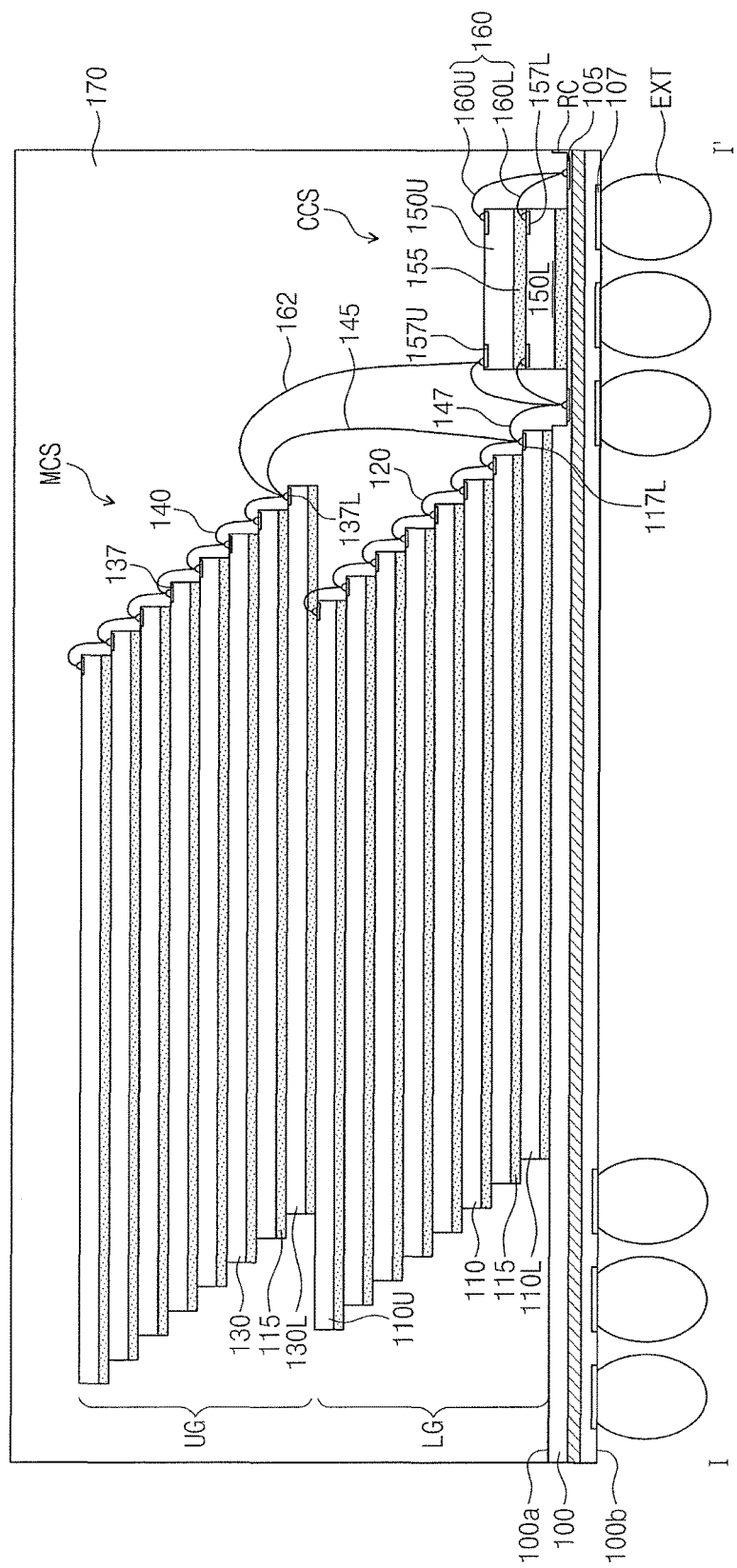

FIG. 1 illustrates a plan view of a semiconductor package according to an example embodiment. FIGS. 2A, 2B, and 3 illustrate sectional views taken along line I-I' of FIG. 1 according to example embodiments.

Referring to FIGS. 1, 2A, 2B, and 3, a semiconductor package may include a package substrate 100, a memory chip structure MCS, and a controller chip structure CCS.

The package substrate 100 may be, for example, a printed circuit board (PCB). The package substrate 100 may include a first surface 100a, on which the memory chip structure MCS is mounted, and a second surface 100b opposite to the first surface 100a. First pads 105 may be provided on the first surface 100a of the package substrate 100, and second pads 107 may be provided on the second surface 100b of the package substrate 100. A plurality of circuit patterns may be provided in the package substrate 100.

The memory chip structure MCS may include a plurality of memory chips 110 and 130, and first chip adhesion films 115 provided between the memory chips 110 and 130. In some example embodiments, the first chip adhesion films 115 may be provided between the package substrate 100 and the lowermost one (i.e., 110L) of the memory chips 110 and 130. The memory chips 110 and 130 may be stacked one on another in a direction perpendicular to the first surface 100a of the package substrate 100. Each of the memory chips 110 and 130 may be laterally shifted from an underlying one of the memory chips 110 and 130 to expose chip pads 117 and 137.

The plurality of memory chips 110 and 130 may include first memory chips 110 constituting a lower group LG and second memory chips 130 constituting an upper group UG. The first memory chips 110 and the second memory chips 130 may have substantially the same size and structure. In some embodiments, as shown in FIGS. 2A and 2B, the lower group LG may have eight first memory chips 110, and the upper group UG may have eight second memory chips 130. However, FIGS. 2A and 2B are merely examples. The memory chips 110 and 130 may include the chip pads 117 and 137, respectively. For example, each of the first memory chips 110 may include the first chip pad 117, and each of the second memory chips 130 may include the second chip pad 137.

In some embodiments, upper ones of the first memory chips 110 may be shifted in a first direction DR1 from, and stacked on, an underlying one of the first memory chips 110, and upper ones of the second memory chips 130 may be shifted in the first direction DR1 from, and stacked on, an underlying one of the second memory chips 130. For example, the first direction DR1 may be a left direction, and a second direction DR2 may be a right direction. A lowermost second memory chip 130L of the upper group UG, which is provided on an uppermost first memory chip 110U of the lower group LG, may be shifted in the second direction DR2 with respect to the first memory chip 110. For example, the first chip pads 117 of the lower group LG may be provided on right edges of the first memory chips 110, and the second chip pads 137 of the upper group UG may also be provided on right edges of the second memory chips 130. Shifting the chips may provide exposed pads, which may be accessible to, for example, wire bonding equipment.

Each of the first chip adhesion films 115 may be used to attach the lowermost one (e.g., the lowermost first memory chip 110L) of the first memory chips 110 to the package substrate 100, to attach an adjacent pair of the first memory chips 110 to each other, to attach the uppermost first memory chip 110U of the lower group LG to the lowermost second memory chip 130L of the upper group UG, or to attach an adjacent pair of the second memory chips 130 to each other. Each of the first chip adhesion films 115 may have substantially the same size and shape as a corresponding one of the first and second memory chips 110 and 130 thereon.

The memory chip structure MCS may further include first connectors 120, 140, 145, 147, and 162, each of which is provided to electrically connect at least two of the memory chips 110 and 130, the package substrate 100, and the controller chip structure CCS to each other. In some embodiments, at least one of the first connectors 120, 140, 145, 147, and 162 may include, or may be, a bonding wire.

The first connectors 120, 140, 145, 147, and 162 may include chip-to-chip connectors 120, 140, and 145, each of which is provided to electrically connect the memory chips 110 and 130 to each other, a chip-to-substrate connector 147, which is provided to electrically connect at least one of the memory chips 110 and 130 to the package substrate 100, and a structure-to-structure connector 162, which is provided to electrically connect the memory chip structure MCS to the controller chip structure CCS.

The chip-to-chip connectors 120, 140, and 145 may include first bonding wires 120, each of which is provided to connect the first memory chips 110 of the lower group LG to each other, second bonding wires 140, each of which is provided to connect the second memory chips 130 of the upper group UG to each other, and third bonding wires 145, each of which is provided to connect the lower and upper groups LG and UG to each other. Each of the first bonding wires 120 may be provided to electrically connect the first chip pads 117 of at least two adjacent ones of the first memory chips 110 to each other. For example, each of the first bonding wires 120 may be provided to electrically connect four consecutive ones of the first memory chips 110 to each other. Each of the second bonding wires 140 may be provided to electrically connect the second chip pads 137 of at least two adjacent ones of the second memory chips 130 to each other. For example, each of the second bonding wires 140 may be provided to electrically connect four consecutive ones of the second memory chips 130 to each other. The third bonding wire 145 may connect the lowermost first memory chip 110L of the lower group LG to the lowermost second memory chip 130L of the upper group UG. However, the configuration of the chip-to-chip connector 120, 140, and 145 is merely an example.

The chip-to-substrate connector 147 may include at least one of a first bonding wire 147 electrically connecting at least one of the first memory chips 110 of the lower group LG to the package substrate 100 and a second bonding wire electrically connecting at least one of the second memory chips 130 of the upper group UG to the package substrate 100. For example, the first bonding wire 147 may connect the lowermost first memory chip 110L electrically to the package substrate 100. However, the configuration of the chip-to-substrate connector 147 is merely an example.

The structure-to-structure connector 162 may include at least one of a first bonding wire electrically connecting at least one of the first memory chips 110 of the lower group LG to the controller chip structure CCS and a second bonding wire 162 electrically connecting at least one of the second memory chips 130 of the upper group UG to the controller chip structure CCS. For example, the second bonding wire 162 may connect the lowermost second memory chip 130L of the upper group UG electrically to the controller chip structure CCS. However, the configuration of the structure-to-structure connector 162 is merely an example.

Referring to FIG. 2A, the controller chip structure CCS may be mounted on the first surface 100a of the package substrate 100. For example, the controller chip structure CCS may be provided on the first surface 100a of the package substrate 100 to be laterally spaced apart from the memory chip structure MCS. As shown in FIG. 2A, the controller chip structure CCS may be provided at a right side of the memory chip structure MCS, but in some example embodiments, the controller chip structure CCS may be provided at a left side of the memory chip structure MCS. However, the afore-described positions of the memory chip structure MCS are merely examples.

In an example embodiment, referring to FIG. 3, a recessed region RC may be provided at an edge region of the first surface 100a of the package substrate 100, and the controller chip structure CCS may be mounted on the recessed region RC of the first surface 100a of the package substrate 100.

Referring to FIGS. 2A and 3, the controller chip structure CCS may include controller chips 150U and 150L that are vertically stacked on the package substrate 100. Each of the controller chips 150U and 150L may provide, for example, a command, an address, data, and various control signals to control the memory chips 110 and 130.

For the sake of simplicity, the description that follows will refer to an example in which the number of the controller chips is two, but the number of the controller chips is merely an example. The controller chips 150U and 150L may include a lower controller chip 150L and an upper controller chip 150U. First chip pads 157L may be provided on an edge region of the lower controller chip 150L, and second chip pads 157U may be provided on an edge region of the upper controller chip 150U. In some example embodiments, a first set of the memory chips 110 and 130 may be controlled based on signals from the lower controller chip 150L, and a second set of the memory chips 110 and 130 may be controlled based on signals from the upper controller chip 150U. For example, the first memory chips 110 may be controlled based on signals from the lower controller chip 150L and the second memory chips 130 may be controlled based on signals from the upper controller chip 150U. However, the afore-described control relationships between the memory chips 110 and 130 and the controller chips 150U and 150L are merely examples.

The controller chip structure CCS may include second chip adhesion films 155, which are used to attach the lower controller chip 150L to the package substrate 100 and to attach the upper controller chip 150U to the lower controller chip 150L. The second chip adhesion films 155 may be formed of or include substantially the same material as the first chip adhesion films 115. A thickness of each of the second chip films 155 may be greater than that of each of the first chip adhesion films 115.

The controller chip structure CCS may include a second connector 160, which is provided to electrically connect the memory chip structure MCS to the package substrate 100. The second connector 160 may include a bonding wire.

The second connector 160 may be provided to electrically connect at least one of the control chips 150L and 150U to the package substrate 100. For example, the second connector 160 may include first bonding wires 160U, which are provided to connect the second chip pads 157U of the upper controller chip 150U respectively to the first pads 105 of the package substrate 100, and second bonding wires 160L, which are provided to connect the first chip pads 157L of the lower controller chip 150L respectively to the first pads 105 of the package substrate 100.

Referring to FIG. 2B, the lower controller chip 150L of the controller chip structure CCS may be electrically connected to the package substrate 100 through lower solder balls 167L, and upper solder balls 167U may be provided between the lower controller chip 150L and the upper controller chip 150U. A plurality of through-silicon via electrodes TSV may be provided to penetrate the lower controller chip 150L. The lower controller chip 150L and the upper controller chip 150U may be electrically connected to each other through the via electrodes TSV.

Since, as described above, the controller chips 150U and 150L are vertically stacked, it is possible to reduce an occupying area of the controller chip structure CCS on the package substrate 100 and thereby to increase a relative area of the memory chip structure MCS.

The semiconductor package may further include a mold layer 170, which is provided on the first surface 100a of the package substrate 100 to cover the memory chip structure MCS and the controller chip structure CCS. Outer terminals EXT may be provided to be in contact with the second pads 107 that are provided on the second surface 100b of the package substrate 100, and each of the outer terminals EXT may be a solder ball.

Figure 4:
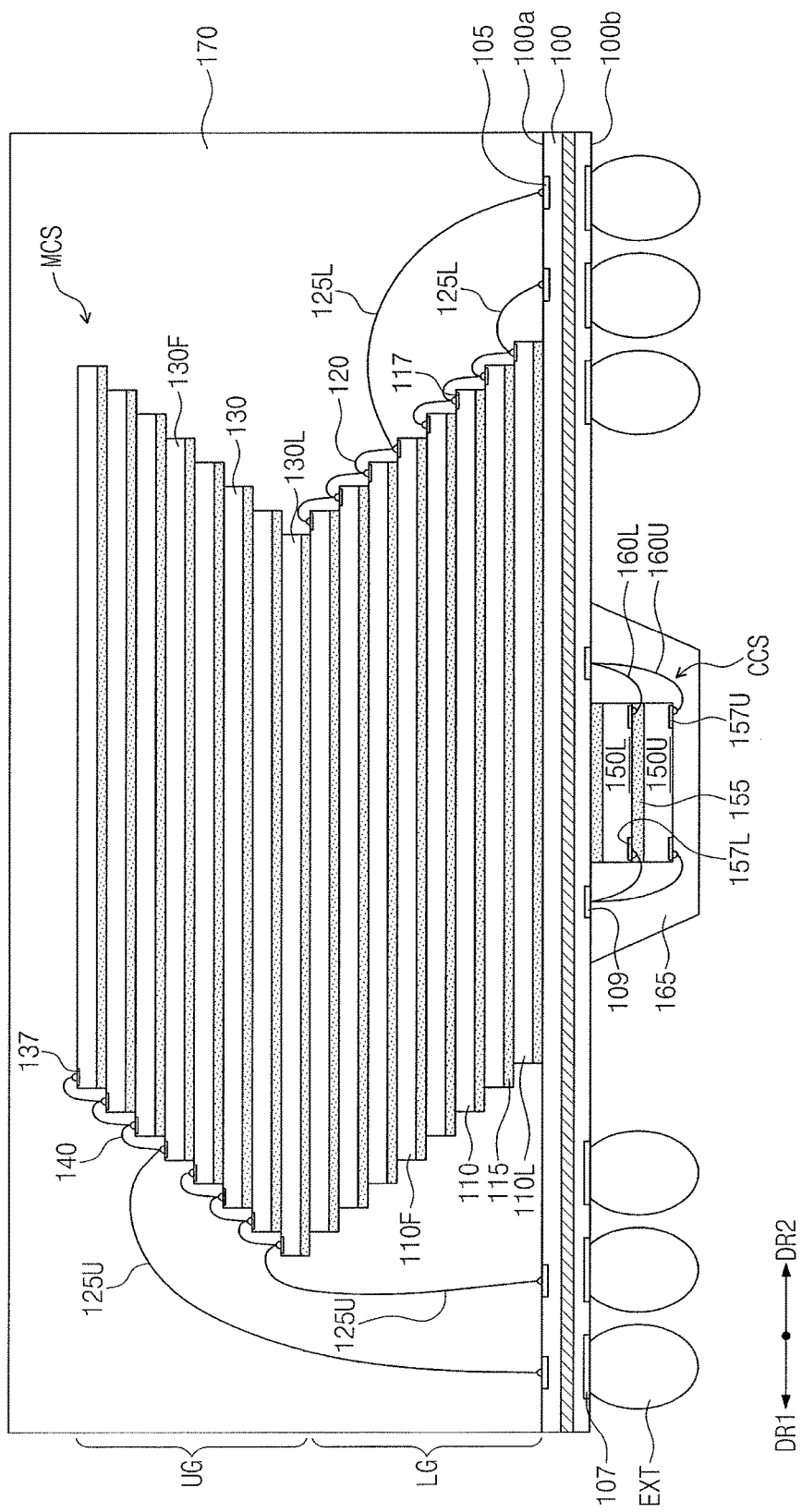
FIGS. 4 and 5 illustrate sectional views of semiconductor packages according to example embodiments.
Figure 5:
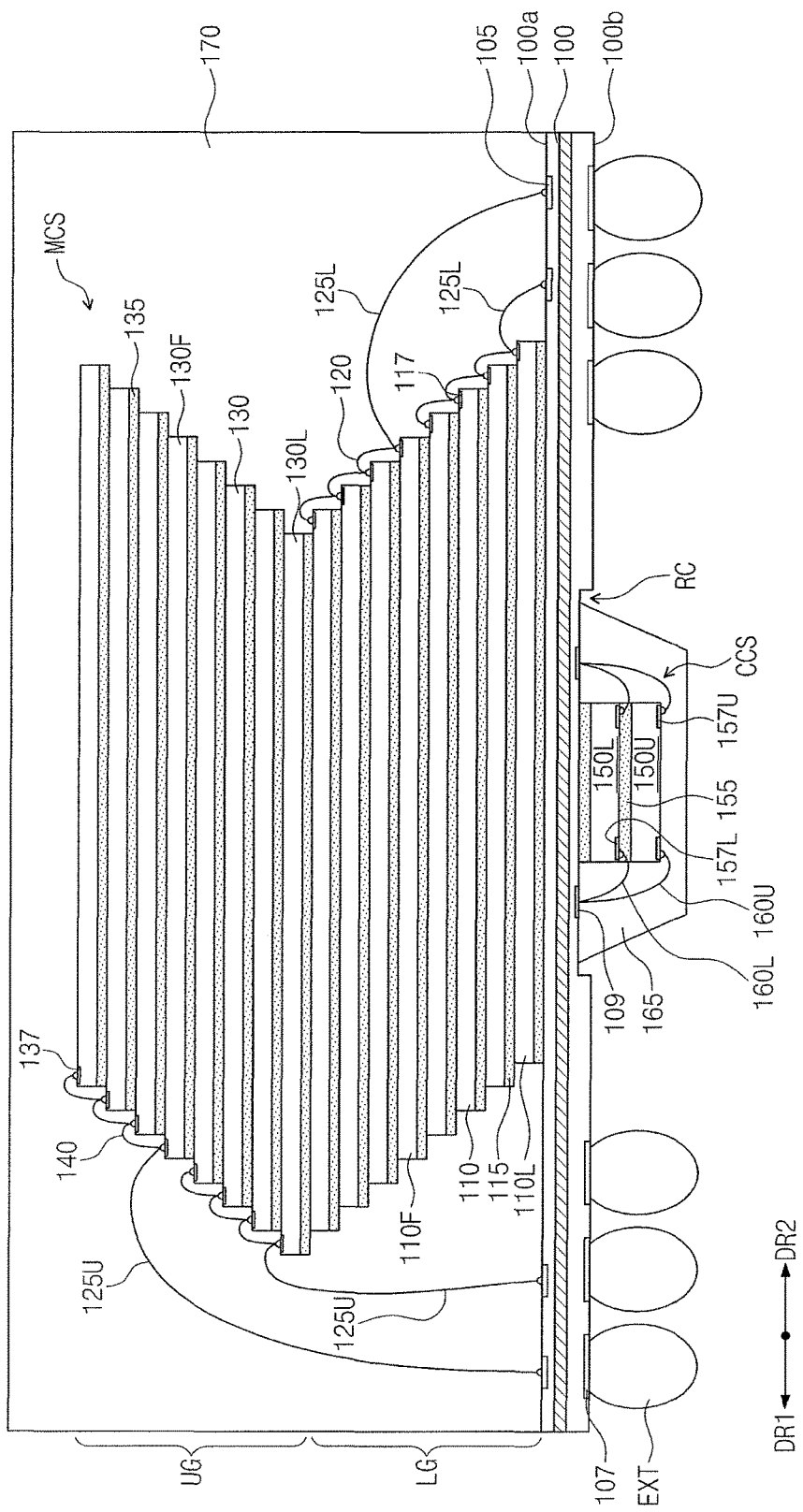

FIGS. 4 and 5 illustrate sectional views of semiconductor packages according to example embodiments.

Referring to FIGS. 4 and 5, a semiconductor package may include the package substrate 100, the memory chip structure MCS, and the controller chip structure CCS.

The package substrate 100 may include the first surface 100a, on which the memory chip structure MCS is mounted, and the second surface 100b opposite to the first surface 100a. First pads 105 may be provided on the first surface 100a.

The memory chip structure MCS may include the plurality of memory chips 110 and 130 and the first chip adhesion films 115 provided between the memory chips 110 and 130, and in some example embodiments, the first chip adhesion films 115 may be provided between the package substrate 100 and the lowermost chip 110L of the memory chips 110 and 130. The memory chips 110 and 130 may be stacked one on another in a direction perpendicular to the first surface 100a of the package substrate 100. Upper ones of the memory chips 110 and 130 may be laterally shifted from an underlying one of the memory chips 110 and 130 to expose the chip pads 117 and 137.

The plurality of memory chips 110 and 130 may include eight first memory chips 110 constituting the lower group LG and eight second memory chips 130 constituting the upper group UG. However, FIGS. 4 and 5 are merely examples. The memory chips 110 and 130 may include the chip pads 117 and 137, respectively. For example, each of the first memory chips 110 may include the first chip pad 117, and each of the second memory chips 130 may include the second chip pad 137.

In some embodiments, each of the first memory chips 110 of the lower group LG may be shifted in the first direction DR1 from and stacked on an underlying one of the first memory chips 110, and each of the second memory chips 130 of the upper group UG may be shifted in the second direction DR2, which is opposite to the first direction DR1, from and stacked on an underlying one of the second memory chips 130. For example, the first direction DR1 may be a left direction, and the second direction DR2 may be a right direction. In this case, the first chip pads 117 of the lower group LG may be provided on right edges of the first memory chips 110, and the second chip pads 137 of the upper group UG may be provided on left edges of the second memory chips 130.

Each of the first chip adhesion films 115 may be provided to attach the lowermost first memory chip 110L of the first memory chips 110 to the package substrate 100, to attach an adjacent pair of the first memory chips 110 to each other, to attach the uppermost first memory chip 110U of the lower group LG to the lowermost second memory chip 130L of the upper group UG, and to attach an adjacent pair of the second memory chips 130. Each of the first chip adhesion films 115 may have substantially the same size and shape as a corresponding one of the first and second memory chips 110 and 130 thereon.

The memory chip structure MCS may further include a first connector 120, 140, 125L, and 125U electrically connecting the memory chips 110 and 130 to the package substrate 100. The first connector 120, 140, 125L, and 125U may include a bonding wire.

The first connectors 120, 140, 125L, and 125U may include chip-to-chip connectors 120 and 140, which are provided to electrically connect the memory chips 110 and 130 to each other, and chip-to-substrate connectors 125L and 125U, which are provided to electrically connect at least one of the memory chips 110 and 130 to the package substrate 100.

The chip-to-chip connectors 120 and 140 may include at least one of first bonding wires 120, which are provided to connect the first memory chips 110 of the lower group LG to each other, and second bonding wires 140, which are provided to connect the second memory chips 130 of the upper group UG to each other. Each of the first bonding wires 120 may be provided to electrically connect the first chip pads 117 of at least two adjacent ones of the first memory chips 110 to each other. For example, each of the first bonding wires 120 may be provided to electrically connect four consecutive ones of the first memory chips 110 to each other. Each of the second bonding wires 140 may be provided to electrically connect the second chip pads 137 of at least two adjacent ones of the second memory chips 130 to each other. For example, each of the second bonding wires 140 may be provided to electrically connect four consecutive ones of the second memory chips 130 to each other.

The chip-to-substrate connector 125L and 125U may include at least one of first bonding wires 125L, which are provided to connect at least one of the first memory chips 110 of the lower group LG to the package substrate 100, and second bonding wires 125U, which are provided to connect at least one of the second memory chips 130 of the upper group UG to the package substrate 100. For example, a pair of the first bonding wires 125L may be provided. In this case, one of the first bonding wires 125L may be provided to electrically connect the first chip pad 117 of the lowermost first memory chip 110L of the lower group LG to the first pad 105 of the package substrate 100 provided on the first surface 100a. The other of the first bonding wires 125L may be provided to electrically connect the first chip pad 117 of the fifth one 110F of the first memory chips 110 of the lower group LG to the first pad 105 of the package substrate 100. For example, a pair of the second bonding wires 125U may be provided. In this case, one of the second bonding wires 125U may be provided to electrically connect the second chip pad 137 of the lowermost second memory chip 130L of the upper group UG to the first pad 105 of the package substrate 100 provided on the first surface 100a. The other of the second bonding wires 125U may be provided to electrically connect the second chip pad 137 of the fifth one 130F of the second memory chips 130 of the upper group UG to the first pad 105 of the package substrate 100.

The semiconductor package may further include the first mold layer 170 provided on the first surface 100a of the package substrate 100 to cover the memory chip structure MCS.

The controller chip structure CCS and the outer terminals EXT may be provided on the second surface 100b of the package substrate 100. The controller chip structure CCS may be provided on a center region of the second surface 100b of the package substrate 100, and the outer terminals EXT may be provided on an edge region of the second surface 100b of the package substrate 100.

Referring to FIG. 4, the controller chip structure CCS may be provided on the second surface 100b of the package substrate 100. Referring to FIG. 5, the recessed region RC may be formed at a center region of the second surface 100b of the package substrate 100, and the controller chip structure CCS may be mounted on the recessed region RC of the second surface 100b of the package substrate 100.

The controller chip structure CCS may include two controller chips 150L and 150U, which are vertically stacked on the package substrate 100. The controller chips 150L and 150U may include a lower controller chip 150L and an upper controller chip 150U. However, the number of the controller chips 150L and 150U is merely an example. The first chip pads 157L may be provided on an edge region of the lower controller chip 150L, and the second chip pads 157U may be provided on an edge region of the upper controller chip 150U. In some example embodiments, a first set of the memory chips 110 and 130 may be controlled based on signals from the lower controller chip 150L, and a second set of the memory chips 110 and 130 may be controlled based on signals from the upper controller chip 150U. For example, the first memory chips 110 may be controlled based on signals from the lower controller chip 150L and the second memory chips 130 may be controlled based on signals from the upper controller chip 150U. However, the afore-described control relationships between the memory chips 110 and 130 and the controller chips 150U and 150L are merely examples.

The controller chip structure CCS may include the second chip adhesion films 155, which are used to attach the lower controller chip 150L to the package substrate 100 and to attach the upper controller chip 150U to the lower controller chip 150L. The second chip adhesion films 155 may be formed of or include substantially the same material as the first chip adhesion films 115. A thickness of each of the second chip films 155 may be greater than that of each of the first chip adhesion films 115.

The controller chip structure CCS may include the second connectors 160L and 160U, which are provided to electrically connect the controller chips 150L and 150U to the package substrate 100. Each of the second connectors 160L and 160U may include a bonding wire. In addition, second pads 109 may be provided on the second surface 100b of the package substrate 100, and the second connectors 160L and 160U may be electrically connected to the second pads 109.

The second connector 160L and 160U may include first bonding wires 160L, each of which is provided to electrically connect each of the first chip pads 157L of the lower controller chip 150L to a corresponding one of the second pads 109 of the package substrate 100, and second bonding wires 160U, each of which is provided to electrically connect each of the second chip pads 157U of the upper controller chip 150U to the second surface 100b of the package substrate 100.

In this case, since each of the memory chip structure MCS and the controller chip structure CCS is electrically connected to the package substrate 100, the memory chip structure MCS and the controller chip structure CCS may be electrically connected to each other through the package substrate 100.

The semiconductor package may further include a second mold layer 165, which is provided on the second surface 100b of the package substrate 100 to cover the controller chip structure CCS.

Third pads 107 may be further provided on an edge of the second surface 100b of the package substrate 100, and the third pads 107 may be provided to be in contact with the outer terminals EXT, respectively. Each of the outer terminals EXT may be a solder ball.

Since, as described above, the controller chip structure CCS is disposed on the second surface 100b of the package substrate 100, it is possible to increase a ratio in area of the memory chip structure MCS to the first surface 100a of the package substrate 100. In addition, since the controller chips 150L and 150U are vertically stacked in the controller chip structure CCS, it is possible to reduce an occupying area of the controller chip structure CCS with respect to that of the second surface 100b of the package substrate 100 and to efficiently dispose the controller chip structure CCS along with the outer terminals EXT.

As shown in FIG. 5, in the case where the controller chip structure CCS is mounted on the recessed region RC, it is possible to reduce or eliminate protrusion of the controller chip structure CCS from the outer terminals EXT.

Figure 6:
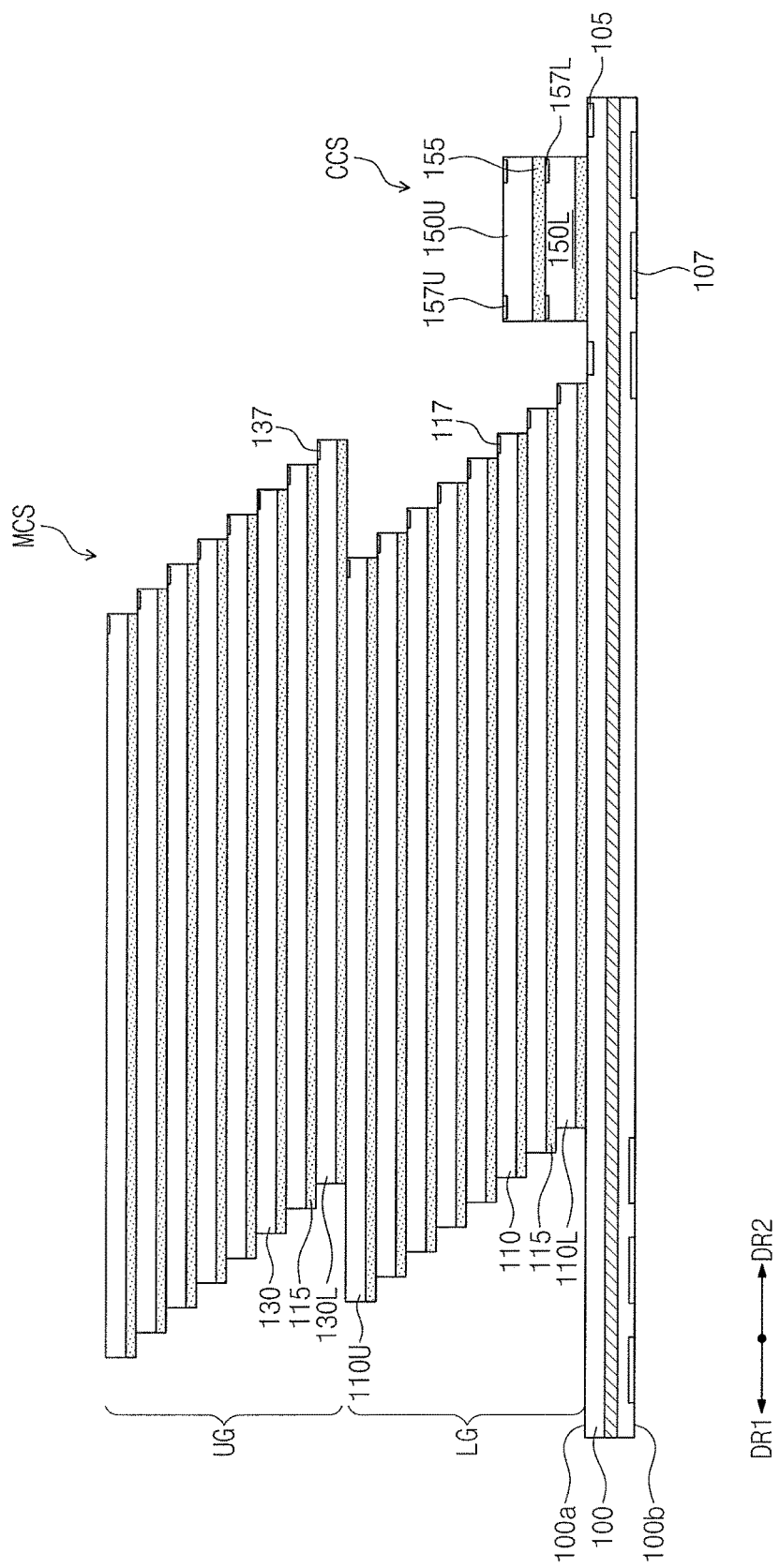
FIGS. 6 to 8 illustrate sectional views of stages in a method of fabricating a semiconductor package according to an example embodiment.
Figure 7:
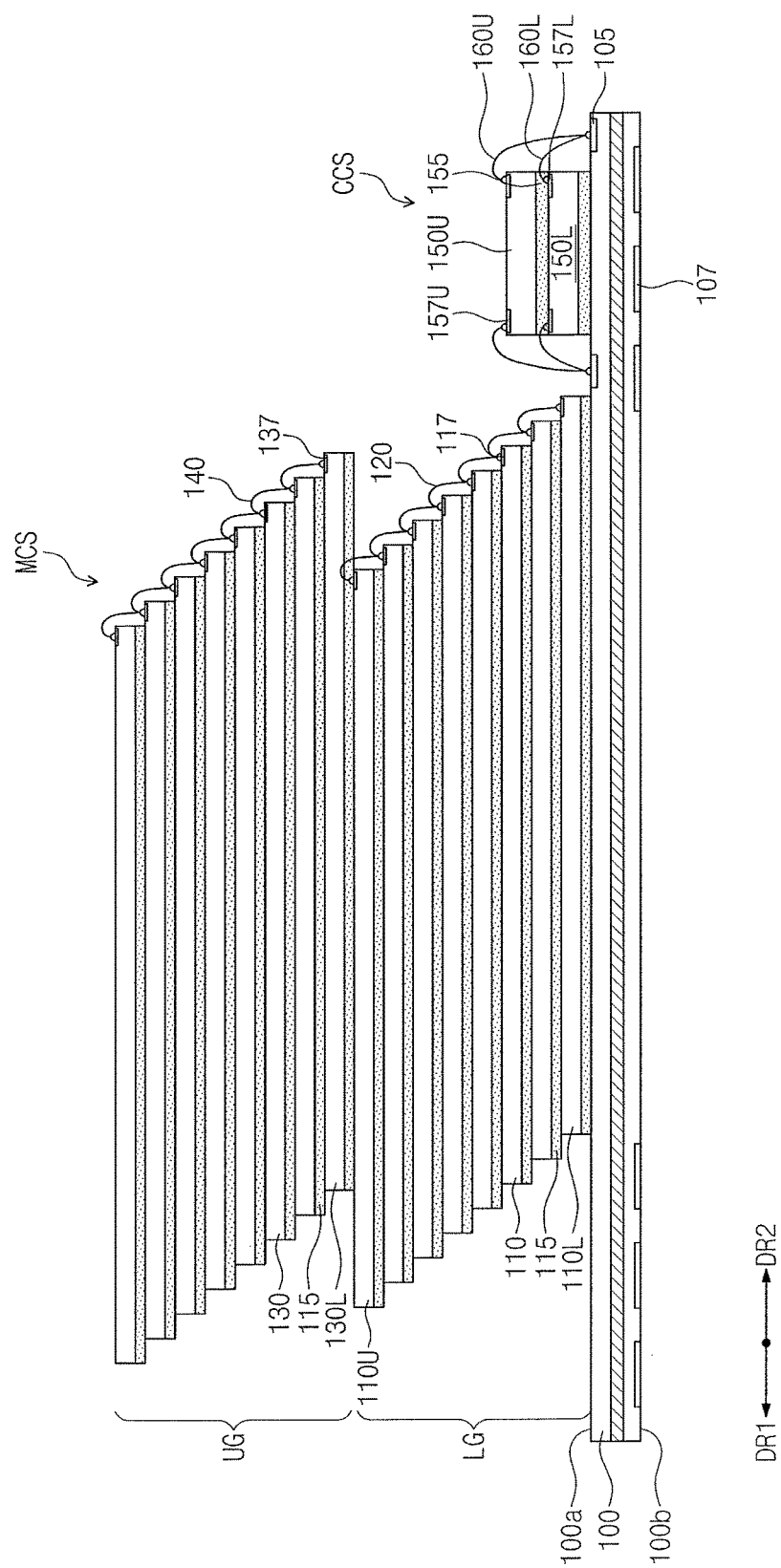
Figure 8:
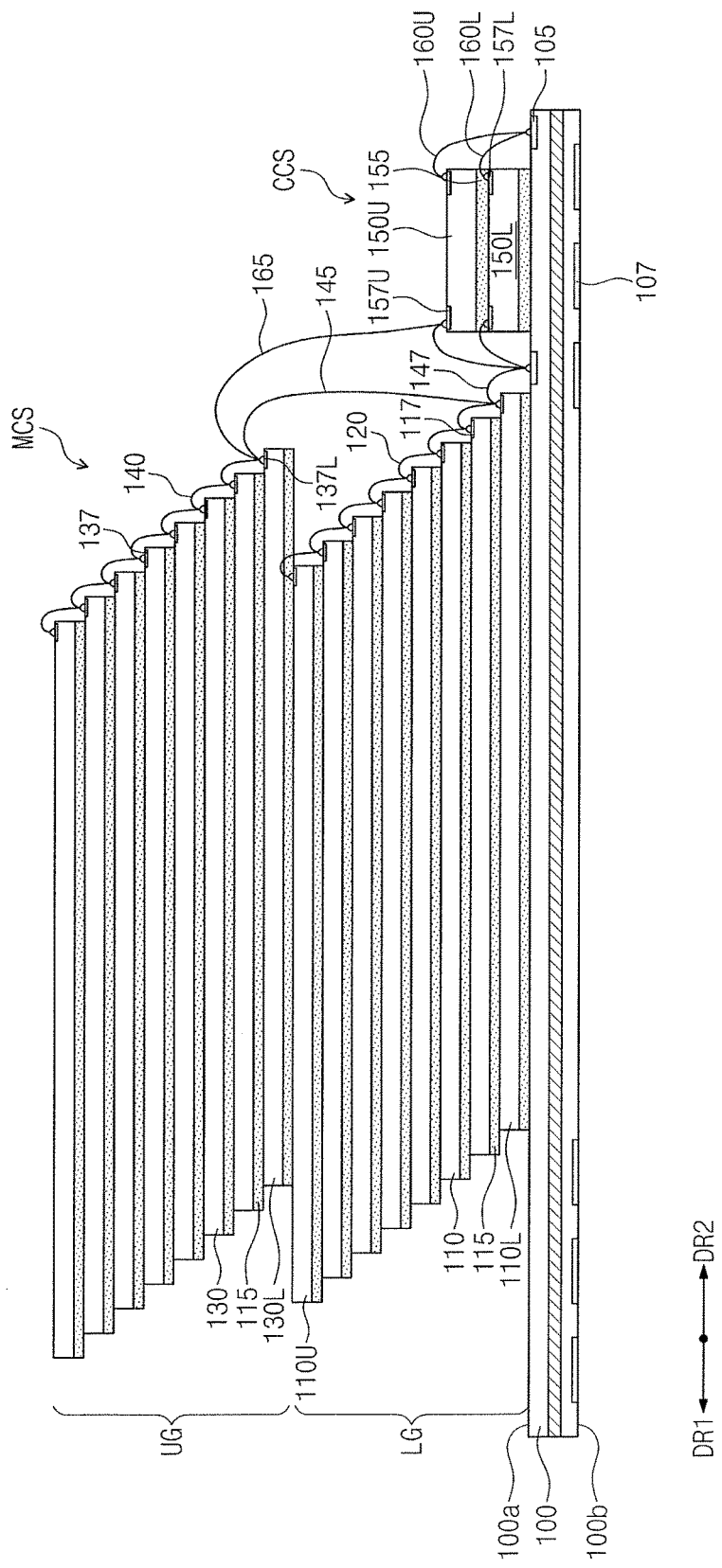

FIGS. 6 to 8 illustrate sectional views of stages in a method of fabricating a semiconductor package according to an example embodiment.

Referring to FIG. 6, the memory chip structure MCS including a plurality of vertically-stacked memory chips 110 and 130 may be mounted on the first surface 100a of the package substrate 100.

In some embodiments, the lower group LG may include eight first memory chips 110 and the upper group UG may include eight second memory chips 130. Here, each of the first memory chips 110 may be shifted in the first direction DR1 from and stacked on an underlying one to expose the first chip pads 117, and each of the second memory chips 130 may be shifted in the first direction DR1 from and stacked on an underlying one to expose the second chip pads 137. When viewed with respect to the uppermost first memory chip 110U of the lower group LG, the lowermost second memory chip 130L of the upper group UG may be shifted in the second direction DR2 opposite to the first direction DR1. For example, the first direction DR1 may be a left direction, and the second direction DR2 may be a right direction.

The first chip adhesion films 115 may be provided to attach the lowermost first memory chip 110L of the lower group LG to the package substrate 100, to attach an adjacent pair of the first memory chips 110, to attach the uppermost first memory chip 110U of the lower group LG to the lowermost second memory chip 130L of the upper group UG, and to attach an adjacent pair of the second memory chips 130. Each of the first chip adhesion films 115 may be formed of or include at least one of impregnable materials.

The controller chip structure CCS including a plurality of vertically-stacked controller chips 150L and 150U may be mounted on the first surface 100a of the package substrate 100.

The second chip adhesion films 155 may be provided to attach the lower controller chip 150L to the package substrate 100 and to attach the upper controller chip 150U to the lower controller chip 150L.

In some example embodiments, the controller chip structure CCS may be configured to include the solder balls 167L and 167U and the through silicon vias TSV, instead of the second chip adhesion films 155. For example, the solder balls 167L and 167U may be provided between the upper controller chip 150U and the lower controller chip 150L, and the through silicon vias TSV may be provided to penetrate the lower controller chip 150L. The package substrate 100 and the lower and upper controller chips 150L and 150U may be electrically connected to each other through the solder balls 167L and 167U and the through silicon vias TSV.

In some example embodiments, the recessed region RC (e.g., see FIG. 3) may be locally formed at an edge region of the package substrate 100, and then, the controller chip structure CCS may be mounted on the recessed region RC. The following wire bonding processes may be further performed to fabricate the semiconductor package shown in FIG. 3.

Referring to FIG. 7, a first wire bonding process may be performed.

For example, a wire bonding process may be performed to form bonding wires electrically connecting the first memory chips 110 of the lower group LG to each other. As an example, each of the first bonding wires 120 may be formed to consecutively connect four adjacent ones of the first memory chips 110. Since the first chip adhesion films 115 are formed of an impregnable material, it is possible to electrically connect the first bonding wire 120 to the first chip pad 117 of the uppermost first memory chip 110, even when the first chip pad 117 of the uppermost first memory chip 110 of the lower group LG is covered with the first chip adhesion film 115.

A wire bonding process may be performed to form bonding wires electrically connecting the second memory chips 130 of the upper group UG to each other. For example, each of the second bonding wires 140 may be formed to consecutively connect four adjacent ones of the second memory chips 130.

A wire bonding process may be performed to form third bonding wires 160L and 160U. For example, the third bonding wires 160L may be formed to connect the first chip pads 157L of the lower controller chip 150L respectively to the first pads 105 of the package substrate 100, and the third bonding wires 160U may be formed to connect the second chip pads 157U of the upper controller chip 150U respectively to the first pads 105 of the package substrate 100.

Referring to FIG. 8, a second wire bonding process may be performed.

For example, a wire bonding process may be performed to form a fourth bonding wire 145 connecting the second chip pad 137 of the lowermost second memory chip 130L of the upper group UG to the first chip pad 117 of the lowermost first memory chip 110L of the lower group LG. A wire bonding process may be performed to form a fifth bonding wire 147 connecting the first chip pad 117 of the lowermost first memory chip 110L of the lower group LG to the first pad 105 of the package substrate 100. In addition, a wire bonding process may be performed to form a sixth bonding wire 162 connecting the second chip pad 137L of the lowermost second memory chip 130L of the upper group UG to the second chip pads 157U of the upper controller chip 150U.

Here, the wire bonding process may be performed three times on the first pad 105 of the package substrate 100. The wire bonding process may be performed three times on the first chip pad 117 of the lowermost first memory chip 110L of the lower group LG. Also, the wire bonding process may be performed three times on the second chip pad 137 of the lowermost second memory chip 130L of the upper group UG. The wire bonding process may be performed two times on the second chip pad 157U of the upper controller chip 150U.

Referring back to FIG. 2A, the first mold layer 170 may be formed on the first surface 100a of the package substrate 100 to cover the memory chip structure MCS and the controller chip structure CCS. Thereafter, the outer terminals EXT may be attached to the second pads 107, respectively, which are formed on the second surface 100b of the package substrate 100.

FIGS. 9 to 12 are sectional views illustrating semiconductor packages according to some embodiments.

Figure 9:
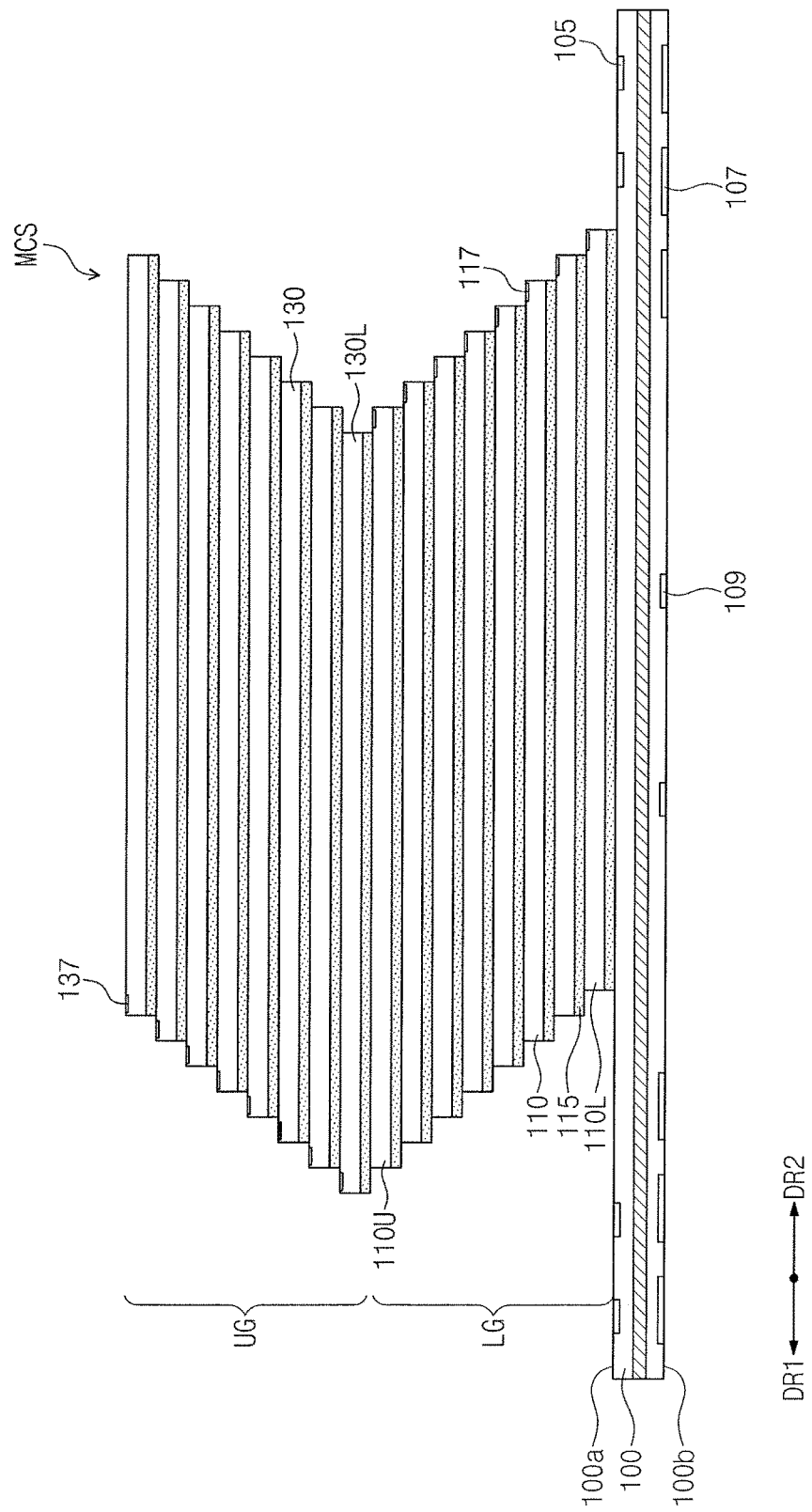
FIGS. 9 to 12 illustrate sectional views of stages in a method of fabricating a semiconductor package according to an example embodiment.

Referring to FIG. 9, the memory chip structure MCS including a plurality of vertically-stacked memory chips may be mounted on the first surface 100a of the package substrate 100.

In some embodiments, the lower group LG may include eight first memory chips 110 and the upper group UG may include eight second memory chips 130. Here, each of the first memory chips 110 may be shifted in the first direction DR1 from and stacked on an underlying one to expose the first chip pads 117, and each of the second memory chips 130 may be shifted in the second direction DR2 opposite to the first direction DR1 from and stacked on an underlying one to expose the second chip pads 137. For example, the first direction DR1 may be a left direction, and the second direction DR2 may be a right direction.

The first chip adhesion films 115 may be provided to attach the lowermost first memory chip 110L of the lower group LG to the package substrate 100, to attach an adjacent pair of the first memory chips 110 to each other, to attach the uppermost first memory chip 110U of the lower group LG to the lowermost second memory chip 130L of the upper group UG, and to attach an adjacent pair of the second memory chips 130 to each other.

Figure 10:
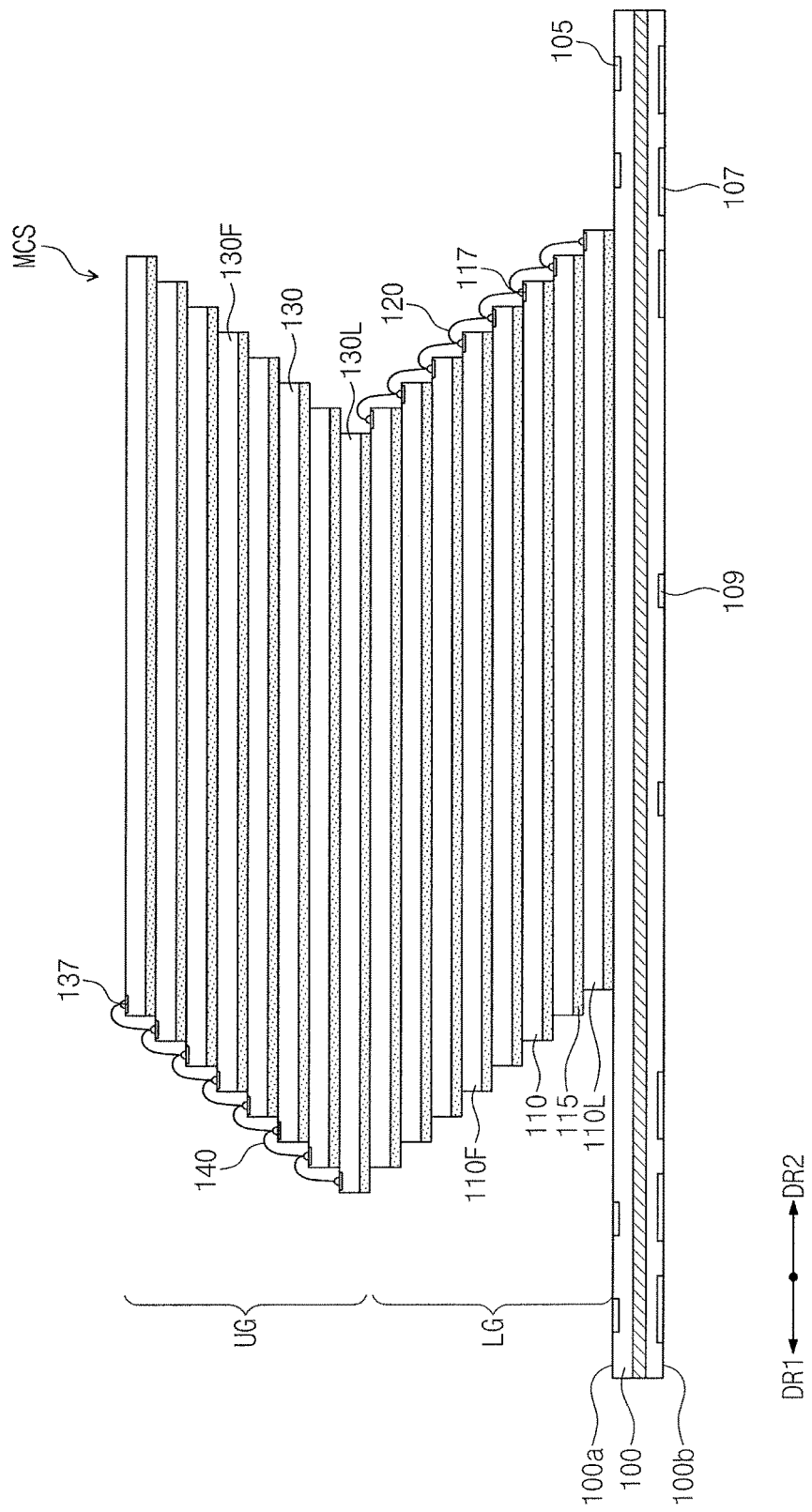

Referring to FIG. 10, a first wire bonding process may be performed.

For example, a wire bonding process may be performed to form bonding wires electrically connecting the first memory chips 110 of the lower group LG to each other. As an example, each of the first bonding wires 120 may be formed to consecutively connect four adjacent ones of the first memory chips 110.

A wire bonding process may be performed to form bonding wires electrically connecting the second memory chips 130 of the upper group UG to each other. For example, each of the second bonding wires 140 may be formed to consecutively connect four adjacent ones of the second memory chips 130.

Figure 11:
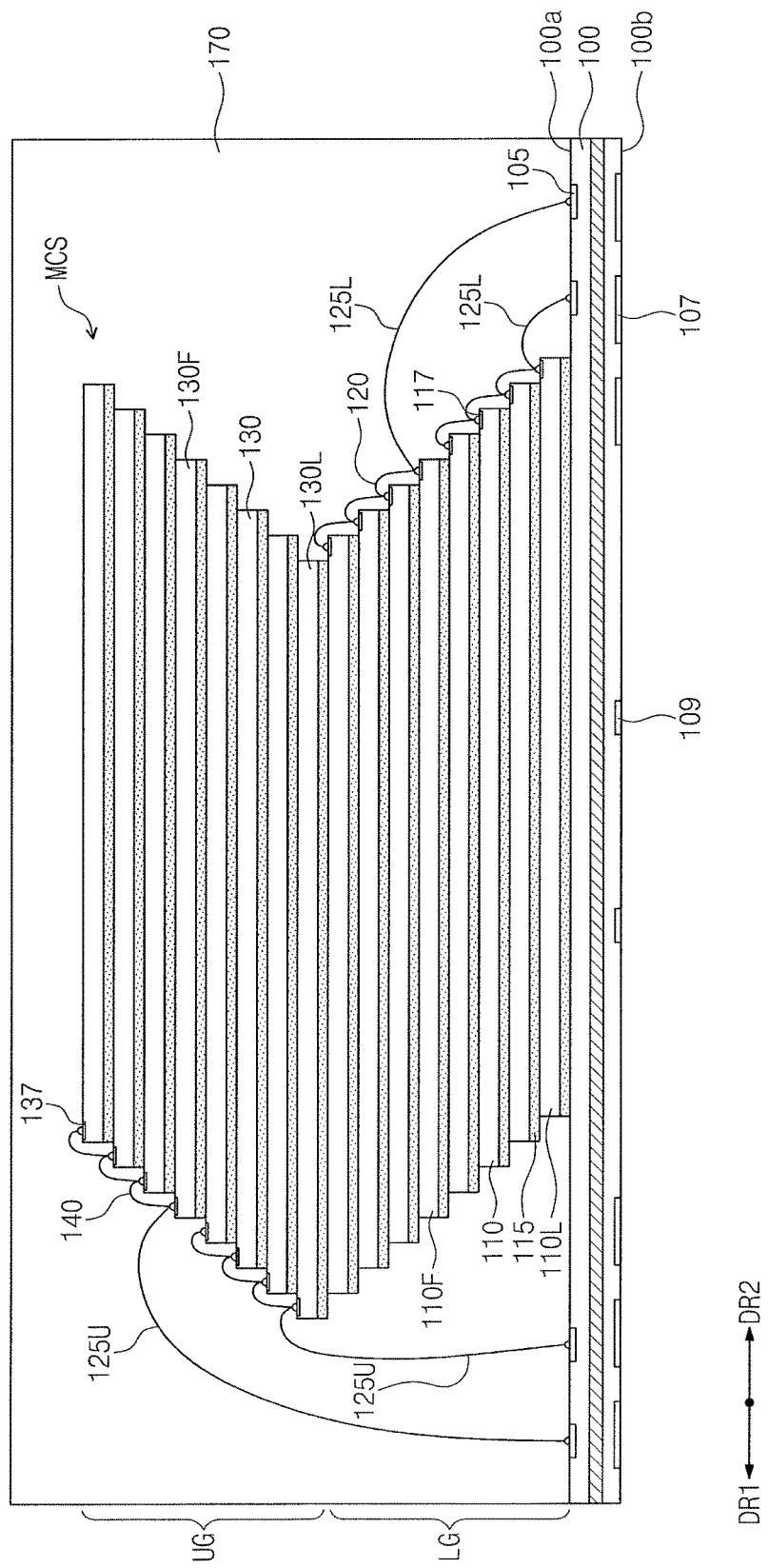

Referring to FIG. 11, a second wire bonding process may be performed.

For example, a wire bonding process may be performed to form third bonding wires 125L electrically connecting the first chip pads 117 of the first and fifth ones 110L and 110F of the first memory chips of the lower group LG to the first pads 105 of the package substrate 100. A wire bonding process may be performed to form fourth bonding wires 125U electrically connecting the second chip pads 137 of the first and fifth ones 130L and 130F of the second memory chips of the upper group UG to the first pads 105 of the package substrate 100.

Here, the wire bonding process may be performed two times on each of the first chip pads 117 of the first and fifth ones 110L and 110F and on each of the second chip pads 137 of the first and fifth ones 130L and 130F.

Thereafter, the first mold layer 170 may be formed on the first surface 100a of the package substrate 100 to cover the memory chip structure MCS.

Figure 12:
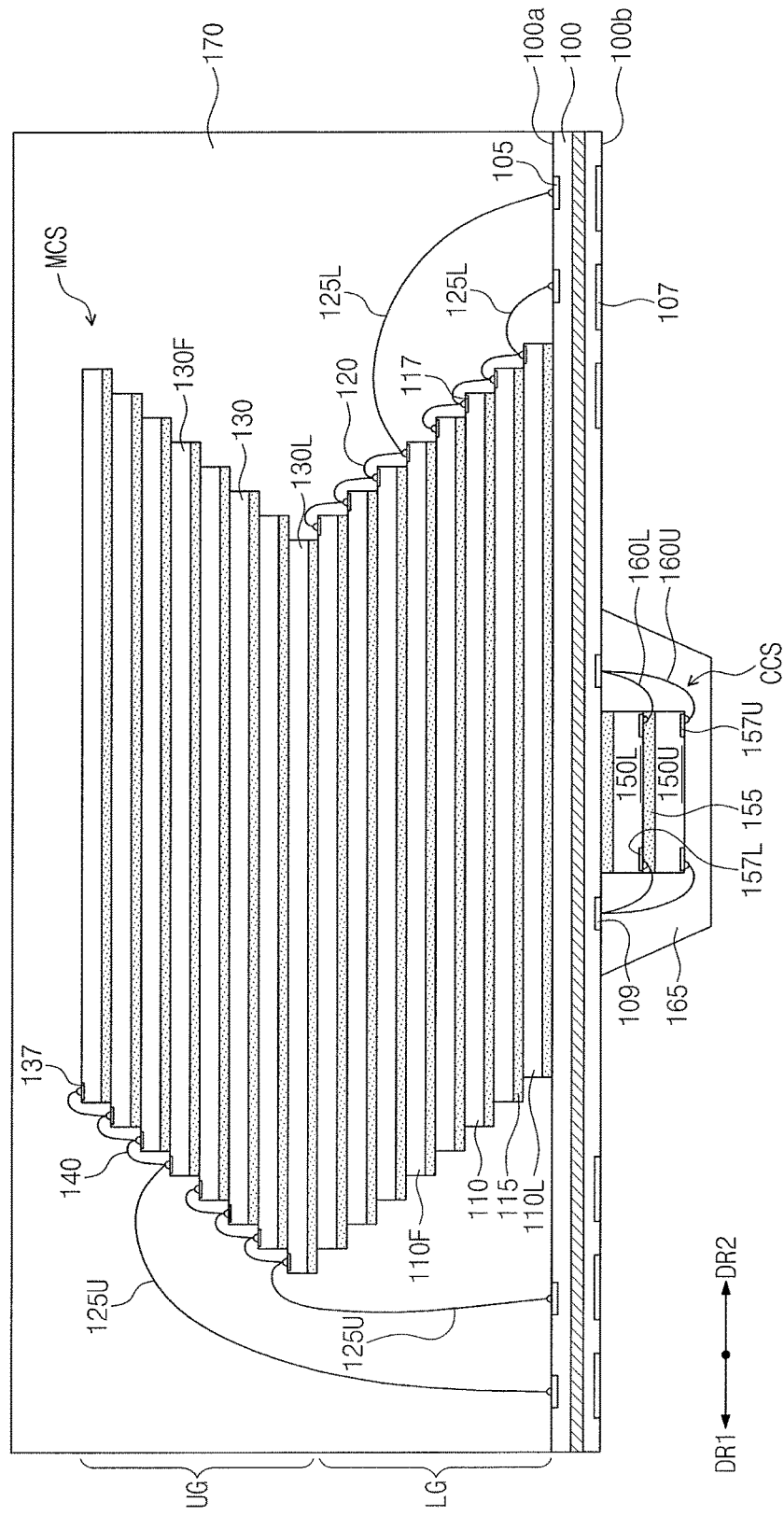

Referring to FIG. 12, the controller chip structure CCS including a plurality of vertically-stacked controller chips 150L and 150U may be mounted on the second surface 100b of the package substrate 100.

The second chip adhesion films 155 may be formed to attach the lower controller chip 150L to the package substrate 100 and to attach the upper controller chip 150U to the lower controller chip 150L.

A wire bonding process may be performed to form fifth bonding wires 160L electrically connecting the first chip pads 157L of the lower controller chip 150L respectively to the second pads 109 of the package substrate 100 and to form sixth bonding wires 160U electrically connecting the second chip pads 157U of the upper controller chip 150U respectively to the second pads 109 of the package substrate 100.

The second mold layer 165 may be formed on the second surface 100b of the package substrate 100 to cover the controller chip structure CCS.

In some example embodiments, the recessed region RC (e.g., see FIG. 5) may be formed at a center region of the second surface 100b of the package substrate 100, and then, the controller chip structure CCS may be mounted on the recessed region RC. The package substrate 100 prepared by the above process may be used to realize the semiconductor package shown in FIG. 5.

Referring back to FIG. 4, the outer terminals EXT may be attached to the third pads 107 formed on the second surface 100b of the package substrate 100.

As described above, embodiments may provide a semiconductor package with high density and high performance.

According to some embodiments, a memory chip structure including a vertically-stacked memory chips is mounted on a package substrate of a semiconductor package, and a controller chip structure including vertically-stacked controller chips is mounted on at least one of two opposite surfaces of the package substrate. This may make it possible to reduce an occupying area of the controller chip structure and to increase a ratio in area of the memory chip structure to the package substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a package substrate including a first surface and a second surface opposite to each other;
    memory chips on the first surface of the package substrate; and
    controller chips vertically stacked on at least one of the first and second surfaces of the package substrate and electrically connected to the memory chips and the package substrate.

2. The semiconductor package as claimed in claim 1, wherein the controller chips are mounted on the first surface of the package substrate and are spaced apart from the memory chips in a horizontal direction.

3. The semiconductor package as claimed in claim 1, wherein the first surface of the package substrate has a recessed region on which the controller chips are mounted.

4. The semiconductor package as claimed in claim 1, wherein the memory chips are mounted on a center region of the first surface of the package substrate, and
    the controller chips are mounted on an edge region of the first surface of the package substrate.

5. The semiconductor package as claimed in claim 1, wherein the controller chips are mounted on the second surface of the package substrate.

6. The semiconductor package as claimed in claim 5, further comprising outer terminals provided on the second surface of the package substrate,
    wherein the controller chips are on a center region of the second surface of the package substrate, and
    the outer terminals are on an edge region of the second surface of the package substrate.

7. The semiconductor package as claimed in claim 1, wherein the second surface of the package substrate has a recessed region on which the controller chips are mounted.

8. The semiconductor package as claimed in claim 7, wherein the recessed region is in a center region of the second surface of the package substrate.

9. The semiconductor package as claimed in claim 1, wherein the memory chips include chip pads, respectively, which are provided at edge regions thereof, and
at least some of the memory chips are respectively shifted in a direction from an underlying one of the memory chips such that the chip pad of the underlying one of the memory chips is exposed.

10. The semiconductor package as claimed in claim 9, wherein the memory chips include:
first memory chips constituting a lower group; and
second memory chips provided on the lower group to constitute an upper group,
wherein:
upper ones of the first memory chips are respectively shifted in a first direction from an underlying one of the first memory chips,
upper ones of the second memory chips are respectively shifted in the first direction from an underlying one of the second memory chips, and
the lowermost one of the second memory chips of the upper group is shifted, in a second direction opposite to the first direction, from the uppermost one of the first memory chips of the lower group.

11. The semiconductor package as claimed in claim 10, further comprising a connector electrically connecting the memory chips, the controller chips, and the package substrate to each other.

12. The semiconductor package as claimed in claim 11, wherein the connector includes:
a chip-to-chip connector electrically connecting at least two of the first memory chips to each other, electrically connecting at least two of the second memory chips to each other, or electrically connecting the upper group to the lower group;
a chip-to-substrate connector electrically connecting at least one of the first memory chips, at least one of the second memory chips, or at least one of the controller chips to the package substrate; and
a structure-to-structure connector electrically connecting at least one of the first and second memory chips to at least one of the controller chips.

13. The semiconductor package as claimed in claim 9, wherein the memory chips include:
first memory chips constituting a lower group; and
second memory chips provided on the lower group to constitute an upper group,
wherein:
upper ones of the first memory chips are respectively shifted in a first direction from an underlying one of the first memory chips, and
upper ones of the second memory chips are respectively shifted, in a second direction opposite to the first direction, from an underlying one of the second memory chips.

14. The semiconductor package as claimed in claim 13, further comprising a connector electrically connecting at least one of the first memory chips, at least one of the second memory chips, or at least one of the controller chips to the package substrate.

15. A semiconductor package, comprising:
a package substrate including a first surface and a second surface opposite to each other;
a memory chip structure including memory chips vertically stacked on the first surface of the package substrate; and
a controller chip structure on the second surface of the package substrate and including at least two controller chips vertically stacked on the package substrate,
wherein the memory chip structure further includes:
first bonding wires, each of which is provided to electrically connect at least two of the memory chips to each other; and
second bonding wires, each of which is provided to electrically connect at least one of the memory chips to the package substrate,
wherein the controller chip structure further includes third bonding wires, each of which is provided to electrically connect one of the controller chips to the package substrate.

16. A semiconductor device, comprising:
first semiconductor chips arranged in a first stack on a substrate, the first semiconductor chips being memory controllers; and
second semiconductor chips arranged in a second stack on the substrate, the second semiconductor chips being memory chips controlled based on signals from the first semiconductor chips, the second semiconductor chips including a first set of second semiconductor chips controlled by a first one of the first semiconductor chips, and including a second set of second semiconductor chips controlled by a second one of the first semiconductor chips.

17. The semiconductor device as claimed in claim 16, wherein each of the first and second semiconductor chips has a wire bonded connection.

18. The semiconductor device as claimed in claim 16, wherein the first semiconductor chips are each identical to one another and the second semiconductor chips are each identical to one another, and the first semiconductor chips are different from the second semiconductor chips.

19. The semiconductor device as claimed in claim 16, wherein the first stack is offset on the substrate laterally from the second stack, and the substrate under the first stack is thinner than the substrate under the second stack.

20. The semiconductor device as claimed in claim 16, wherein the second stack is on an opposite side of the substrate from the first stack, and the second stack is in a recess in the substrate, portions of the substrate that are spaced apart laterally from the second stack being thicker than the substrate at the recess.

* * * * *